(12) United States Patent
Allen et al.

(10) Patent No.: US 9,167,684 B2
(45) Date of Patent: Oct. 20, 2015

(54) APPARATUS AND METHOD FOR FORMING PRINTED CIRCUIT BOARD USING FLUID RESERVOIRS AND CONNECTED FLUID CHANNELS

(71) Applicant: Nokia Corporation, Espoo (FI)

(72) Inventors: Mark Lee Allen, Cambridge (GB); Chris Bower, Cambridgeshire (GB); Darryl Cotton, Cambridgeshire (GB)

(73) Assignee: Nokia Technologies Oy, Espoo (FI)

( * ) Notice: Subject to any disclaimer, the term of this patent is extended or adjusted under 35 U.S.C. 154(b) by 243 days.

(21) Appl. No.: 13/902,149

(22) Filed: May 24, 2013

(65) Prior Publication Data
US 2014/0345924 A1 Nov. 27, 2014

(51) Int. Cl.
*H05K 1/16* (2006.01)
*H05K 1/11* (2006.01)
*H05K 1/02* (2006.01)
*H05K 1/09* (2006.01)
(Continued)

(52) U.S. Cl.
CPC .............. *H05K 1/0272* (2013.01); *H01L 24/00* (2013.01); *H05K 1/092* (2013.01); *H05K 3/101* (2013.01); *H05K 3/107* (2013.01); *H05K 1/097* (2013.01); *H05K 2201/0257* (2013.01); *H05K 2201/0302* (2013.01); *H05K 2201/09036* (2013.01); *H05K 2201/09227* (2013.01); *H05K 2201/10674* (2013.01); *H05K 2203/1469* (2013.01); *Y10T 29/49117* (2015.01)

(58) Field of Classification Search
CPC ................ H05K 1/0272; H05K 1/092; H05K 2201/09227; H05K 2201/0302; Y10T 29/49117

USPC ........... 174/260–261; 361/760, 777, 779, 783
See application file for complete search history.

(56) References Cited

U.S. PATENT DOCUMENTS 4,893,216 A * 1/1990 Hagner ......................... 361/774
5,250,319 A * 10/1993 Ohsako ....................... 427/96.8
(Continued)

FOREIGN PATENT DOCUMENTS

WO    WO-00/19184 A1    4/2000
WO    WO-2009/027625 A2    3/2009

OTHER PUBLICATIONS

Lee, K. J. et al., "Large-Area, Selective Transfer of Microstructured Silicon: A Printing-Based Approach to High-Performance Thin-Film Transistors Supported on Flexible Substrates", Advanced Material, vol. 17, Issue 19, pp. 2332-2336, Oct. 2005.
(Continued)

*Primary Examiner* — Hoa C Nguyen
(74) *Attorney, Agent, or Firm* — Harrington & Smith

(57) ABSTRACT

A substrate including a fluid reservoir and a connected fluid channel, the fluid reservoir positioned away from a component region of the substrate, the fluid channel configured to extend from the fluid reservoir to guide an electrically conductive fluid from the fluid reservoir at a reservoir end of the fluid channel through the fluid channel to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the fluid reservoir and fluid channel.

20 Claims, 6 Drawing Sheets

(51) Int. Cl.
  *H01L 23/00* (2006.01)
  *H05K 3/10* (2006.01)

(56) References Cited

U.S. PATENT DOCUMENTS

| | | | |
|---|---|---|---|
| 8,020,290 B2 | 9/2011 | Sheats | 29/842 |
| 8,031,217 B2 | 10/2011 | Sheats | 347/208 |
| 8,124,452 B2 | 2/2012 | Sheats | 438/109 |
| 8,153,517 B2 | 4/2012 | Sheats | 438/613 |
| 2006/0237229 A1 | 10/2006 | Sugahara | 174/266 |
| 2008/0171450 A1 | 7/2008 | Molkkari et al. | 439/65 |
| 2008/0176359 A1 | 7/2008 | Molkkari et al. | 438/110 |
| 2008/0236890 A1 | 10/2008 | Sugahara | 174/9 F |
| 2010/0175610 A1* | 7/2010 | Bower et al. | 116/217 |
| 2010/0252186 A1 | 10/2010 | Sheats | 156/273.3 |
| 2010/0255179 A1 | 10/2010 | Knox et al. | 427/8 |
| 2010/0314718 A1 | 12/2010 | Sheats | 257/618 |
| 2010/0314719 A1 | 12/2010 | Sheats | 257/618 |
| 2010/0314734 A1 | 12/2010 | Sheats | 257/685 |
| 2010/0314751 A1 | 12/2010 | Sheats | 257/734 |
| 2011/0189824 A1 | 8/2011 | Zenz | 438/119 |
| 2012/0275119 A1* | 11/2012 | Allen et al. | 361/728 |

OTHER PUBLICATIONS

Sheats, J.R. et al., "Printing technology for ubiquitous electronics", Circuit World, ISSN 0305-6120, May 24, 2013, 1 pg.

Pekkanen, Ville, et al., "Utilizing inkjet printing to fabricate electrical interconnections in a system-in-package", Microelectronic Engineering, vol. 87, Issue 11, Nov. 2010, 2 pgs.

Allen, M. et al., "Substrate-facilitated nanoparticle sintering and component interconnection procedure", Nanotechnology, 21(47), 475204, 2010, 7 pgs.

Jeong, S. H., et al., "Liquid alloy printing, of microfluidic stretchable electronics", Lab on a chip, 12(22), 4657-64, 2012 3 pgs.

"Teretag power up your logo", www..terepac.com; May 30, 2013, 2 pgs.

"Welcome to DropAim, where every drop counts", http://www.dropaim.com/; May 30, 2013, 1 pg.

"Your lab on a chip", http://www. vtt.fi/files/services/ele/Your_lab_on_a_chip; 3 pgs.

* cited by examiner

APPARATUS AND METHOD FOR FORMING PRINTED CIRCUIT BOARD USING FLUID RESERVOIRS AND CONNECTED FLUID CHANNELS

TECHNICAL FIELD

The present disclosure relates to the field of printed circuit boards, associated methods and apparatus, and in particular concerns a substrate comprising a fluid channel configured to guide an electrically conductive fluid from a fluid reservoir to a component region of the substrate to enable the formation of an electrical connection to a connector of an electronic component appropriately positioned in the component region. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Existing techniques used for attaching silicon microchips to flexible circuitry include wire bonding, flip-chip bonding, and direct printing of metal ink to form a conductive bridge from the circuitry on the substrate to the pads on the chip. Such methods, however, fail to provide cost-effective assembly of hybrid circuits incorporating small microchips.

The apparatus and methods disclosed herein may or may not address this issue.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided a substrate comprising a fluid reservoir and a connected fluid channel, the fluid reservoir positioned away from a component region of the substrate, the fluid channel configured to extend from the fluid reservoir to guide an electrically conductive fluid from the fluid reservoir at a reservoir end of the fluid channel through the fluid channel to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the fluid reservoir and fluid channel.

One or more of the fluid reservoir and fluid channel may at least partially open onto a surface of the substrate to allow for deposition of the electrically conductive fluid into the fluid reservoir or fluid channel. The component end of the fluid channel may extend into the component region of the substrate to be located underneath the appropriately positioned electronic component. The fluid channel may be configured to extend substantially parallel to the surface of the substrate on which the electronic component is appropriately positioned.

One or more of the size and shape of the fluid channel may be configured to guide the electrically conductive fluid from the fluid reservoir to the component region. One or more of the width and depth of the fluid channel may decrease from the reservoir end to the component end. The fluid channel may have one or more of a depth of between 0.3 and 5 µm, a width of between 2 and 20 µm and a channel angle of between 10 and 120°. The fluid channel may have a square, rectangular, trapezoidal, triangular or concave profile.

The fluid channel may comprise a material configured to guide the electrically conductive fluid from the fluid reservoir to the component region. The fluid channel may comprise a fluidphilic material. One or more of the material and shape of the fluid channel may be such that $\theta < 90° - \alpha/2$, where $\theta$ is the contact angle of the electrically conductive fluid within the fluid channel and $\alpha$ is the channel angle of the fluid channel. One or more of the fluid reservoir and fluid channel may comprise a material such that $\theta < 30°$, where $\theta$ is the contact angle of the electrically conductive fluid within the fluid reservoir or fluid channel.

The fluid reservoir may be dimensioned as a contact pad to allow the appropriately positioned electronic component to be interconnected to the other electronic components using the electrically conductive fluid in the fluid reservoir. The fluid reservoir may have a width of between 20 and 100 µm. In this scenario, the fluid reservoir may comprise a material such that $\theta < 20°$, $\theta < 10°$ or $\theta = 0°$ so that a sufficient amount of electrically conductive fluid remains in the fluid reservoir after guiding to form the contact pad.

The fluid reservoir may comprise a fluidphobic material configured to guide the electrically conductive fluid from the fluid reservoir to the component region via the fluid channel. A region of the substrate surrounding the fluid channel may comprise a fluidphobic material configured to guide any electrically conductive fluid deposited within this region into the fluid channel.

The fluid channel may be configured to guide the electrically conductive fluid from the fluid reservoir to the component region using one or more of capillary action, Laplace pressure, fluidphilic interaction and fluidphobic interaction.

The connector of the appropriately positioned electronic component may comprise a protrusion. The component end of the fluid channel may be configured to receive the protrusion of the connector to enable formation of the electrical connection. The size and shape of the component end may be configured to complement the size and shape of the protrusion.

The substrate may comprise a plurality of fluid channels each configured to extend from a fluid reservoir to guide an electrically conductive fluid from the fluid reservoir at a reservoir end of the fluid channel through the fluid channel to a component end of the fluid channel. The component end of each fluid channel may extend to the component region of the substrate to enable the formation of an electrical connection to a connector of the appropriately positioned electronic component. The fluid channels may be connected to, and extend from, the same or respective fluid reservoirs.

The plurality of fluid channels may be configured such that the component end of each fluid channel extends to the component region to enable the formation of an electrical connection to the same connector of the appropriately positioned electronic component. The appropriately positioned electronic component may comprise a plurality of connectors. The plurality of fluid channels may be configured such that the component end of each fluid channel extends to the component region to enable the formation of an electrical connection to a different connector of the appropriately positioned electronic component. The plurality of fluid channels may radiate out from the component region to form a fan-out pattern on the substrate.

The substrate may comprise a conductive trace and a further fluid channel. The further fluid channel may be configured to extend from the fluid reservoir to guide the electrically conductive fluid from the fluid reservoir at a reservoir end of the further fluid channel through the further fluid channel to a circuitry end of the further fluid channel. The circuitry end may extend to the conductive trace to enable the formation of an electrical connection to the conductive trace. Formation of the electrical connection may allow the appropriately placed electronic component to be interconnected to the other electronic components using the electrically conductive fluid in the further fluid channel.

The substrate may comprise a plurality of fluid reservoirs and respective fluid channels. Each fluid reservoir may be connected between its respective fluid channel and a main fluid reservoir and configured to deliver the electrically conductive fluid from the main fluid reservoir to the respective fluid channel. The fluid reservoirs may be connected to the main fluid reservoir via respective linking channels. One or more of the fluid reservoirs, their respective linking channels and the main fluid reservoir may comprise a fluidphobic material configured to guide the electrically conductive fluid from the main fluid reservoir to the component region. One or both of the main fluid reservoir and the linking channels may have a depth which is less than that of the fluid reservoirs and their respective fluid channels.

The electrically conductive fluid may be an electrically conductive ink. The electrically conductive ink may be a metal nanoparticle ink, a metallo-organic decomposition ink or a UV-curable ink. The electrically conductive fluid may have a viscosity of between 1 mPa·s and 100 mPa·s. The electrically conductive fluid may or may not be electrically conductive in its fluid form. The substrate may be reversibly deformable. The substrate may be substantially flexible and/or substantially stretchable. The substrate may comprise one or more of polyethylene naphthalate, polyethylene terephthalate, polyimide, polycarbonate, polydimethylsiloxane and polyurethane.

The substrate may comprise the electronic component electrically connected in the component region via its connector using the electrically conductive fluid in the fluid channel. The electronic component may be one or more of a discrete component, a silicon-based microchip and a surface-mount component. The surface-mount component may be one or more of a resistor, a capacitor, an inductor, a transistor, a diode, a photodiode and a light-emitting diode. The substrate may comprise a protective adhesive on top of the electrical component. The substrate may be a printed circuit board for an electronic device.

According to a further aspect, there is provided an apparatus comprising any substrate described herein. The apparatus may be one or more of an electronic device, a portable electronic device, a telecommunications device, a portable telecommunications device and a module for any of the aforementioned devices.

According to a further aspect, there is provided a method of preparing a substrate, the method comprising:
  forming a fluid reservoir in the substrate such that the fluid reservoir is positioned away from a component region of the substrate; and
  forming a fluid channel in the substrate such that the fluid channel extends from the fluid reservoir to guide an electrically conductive fluid from the fluid reservoir at a reservoir end of the fluid channel through the fluid channel to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the fluid reservoir and fluid channel.

The method may comprise forming the fluid reservoir and fluid channel in the substrate using one or more of hot-embossing, laser ablation, nanoimprinting, photolithography, and casting a substrate material as a solution over a mould before curing.

According to a further aspect, there is provided a method of using a substrate,
  the substrate comprising a fluid reservoir and a connected fluid channel, the fluid reservoir positioned away from a component region of the substrate, the fluid channel configured to extend from the fluid reservoir to guide an electrically conductive fluid from the fluid reservoir at a reservoir end of the fluid channel through the fluid channel to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the fluid reservoir and fluid channel.
  the method comprising:
  appropriately positioning the electronic component in the component region;
  depositing the electrically conductive fluid into the fluid reservoir to allow for guiding of the electrically conductive fluid from the fluid reservoir at the reservoir end of the fluid channel through the fluid channel to the component end of the fluid channel; and
  allowing for solidification of the electrically conductive fluid to form the electrical connection to the connector of the electronic component.

The method may comprise attaching the appropriately positioned electronic component to the component region before depositing the electrically conductive fluid into the fluid reservoir. The method may comprise attaching the electronic component to the component region using an adhesive.

The method may comprise depositing the electrically conductive fluid into the fluid reservoir using one or more of inkjet printing, flexographic printing, gravure printing, aerosol jet printing, dip coating and slot coating.

Allowing for solidification may comprise leaving the electrically conductive fluid for a predetermined period of time to solidify naturally, exposing the electrically conductive fluid to UV light to cure the electrically conductive fluid, or heating the substrate to cure/sinter the electrically conductive fluid.

The method may comprise depositing a protective adhesive on top of the electronic component after the electrical connection has been formed.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

DESCRIPTION OF SPECIFIC ASPECTS/EMBODIMENTS

Figure 1:
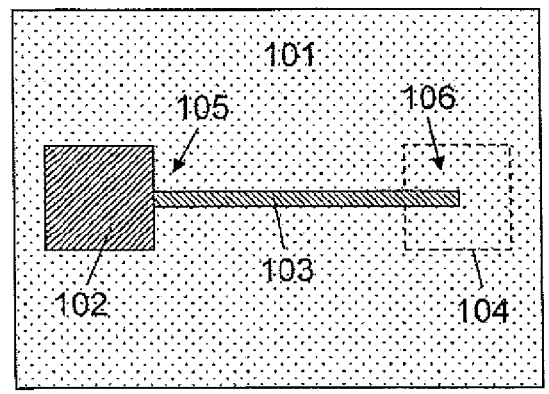
FIG. 1 shows an embodiment of the substrate described herein (plan view)

Flexible/stretchable electronics can enable a host of electronic gadgets with novel form factors. Manufacturing methods used for fabricating electronic components and interconnections (wiring) on flexible and stretchable substrates include vacuum deposition, electroless plating, etching and printing. Printing of electronic circuitry is particularly attractive for producing customized circuits using direct-write (e.g. inkjet) printing whereas mass-printing methods (gravure, flexo, screen) are foreseen to enable cost-effective manufacturing of large-area circuits exhibiting a low density of components.

Whilst printing methods are routinely demonstrated for patterning conductors and forming simple electronic components (capacitors and inductors as well as low-performance diodes and transistors), conventional silicon-based microchips are generally required for carrying out all "computation" beyond the most simple and low speed operations. Silicon ICs are produced at extremely high component density, which translates to a very low "cost per function". A cost-effective manufacturing approach would indeed be to design the silicon ICs on the wafer as comprised of separate small units each carrying out various basic "computational", "signal processing" and "data storage" operations such that after dicing, any selection of these individual units can be integrated onto the flexible/stretchable carrier with much freedom to design a unique layout to meet product design/usability requirements. The bottlenecks for manufacturing this kind of hybrid circuit are the limitations associated with currently used methods for handling, aligning and bonding extremely small silicon die with flexible/stretchable conductors.

Techniques used for attaching silicon microchips to flexible circuitry include wire bonding, flip-chip bonding, and direct printing of metal ink to form a conductive bridge from the circuitry on the substrate to the pads on the chip. These methods can be categorized into two types of approaches where either (i) the chip is placed "active side down" onto the substrate and the chip pads are connected to the underlying conductor pattern with e.g. a conductive adhesive or (ii) the chip is attached or embedded "active side up" on the substrate and the pads are connected to the external circuit for example by wire bonding or by printing a conductor over the chip edge and onto the pads. These techniques are used either for direct chip attachment/bonding to the external circuit or as an intermediate step, where the bare chip is first bonded onto a surface-mountable package (typically wire-bonding from chip pads to a rigid or flexible interposer), which is later assembled onto the flex circuit.

As mentioned in the background section, flip-chip, wire bonding and "over printing" methods fail to provide cost-effective assembly of hybrid circuits incorporating small microchips. This is because (i) the pick-and-place methods, which can achieve sub ±10 μm alignment accuracy with respect to the underlying conductor pattern, are slow and incompatible with handling small (sub 100 μm×100 μm) chips, or (ii) conductor printing onto the "active face" of the chip similarly requires high alignment accuracy as well as high printing resolution (beyond the >50 μm currently obtained with scalable printing methods) and careful optimization of the ink flow behavior across the various material interfaces at the chip edge (it is usually necessary to build some form of leveling slope to enable printing of a continuous conductor from the substrate to the chip). Similarly, wire bonding is a non-scalable method.

The substrate and associated methods disclosed herein may or may not address this issue. As shown in FIG. 1, the substrate 101 comprises a fluid reservoir 102 and a connected fluid channel 103. The fluid reservoir 102 is positioned away from a component region 104 of the substrate 101, and the fluid channel 103 is configured to extend from the fluid reservoir 102 to guide an electrically conductive fluid from the fluid reservoir 102 at a reservoir end 105 of the fluid channel 103 through the fluid channel 103 to a component end 106 of the fluid channel 103. The component end 106 of the fluid channel 103 extends to the component region 104 of the substrate 101 to enable the formation of an electrical connection to a connector of an electronic component appropriately positioned in the component region 104. Formation of the electrical connection allows the electronic component to be interconnected to other electronic components using one or more of the fluid reservoir 102 and fluid channel 103.

In practice, the substrate 101 may comprise one or more fluid reservoirs 102 and one or more fluid channels 103. When the substrate 101 comprises a plurality of fluid channels 103, the fluid channels 103 may be connected to, and extend from, the same or respective fluid reservoirs 102. Furthermore, each fluid channel 103 may be configured to enable the formation of an electrical connection to the same connector of the appropriately positioned electronic component or a different connector of the appropriately positioned electronic component.

Figure 2:
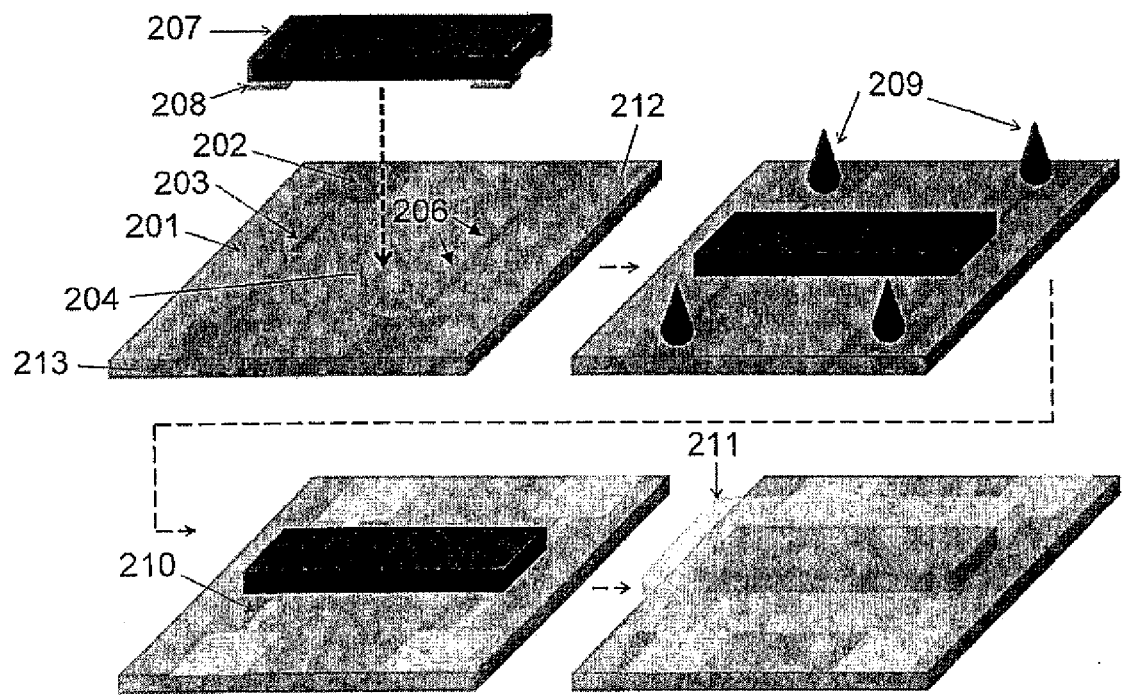
FIG. 2 shows how the substrate described herein can be used to guide an electrically conductive fluid to form an electrical connection to a connector of an electronic component appropriately positioned on the substrate (perspective view)

FIG. 2 shows a substrate 201 comprising four fluid reservoirs 202 and associated fluid channels 203 being used to form respective electrical connections 210 to the four connectors 206 of an electronic component 207. The fluid reservoirs 202 and fluid channels 203 are formed in the substrate 201 before placement of the electronic component 207. This may be achieved using one or more of hot-embossing, laser ablation, nanoimprinting, photolithography, and casting a substrate material as a solution over a mould before curing. The substrate 201 itself may comprise one or more of polyethylene naphthalate (PEN), polyethylene terephthalate (PET), polyimide (PI), polycarbonate (PC), polydimethylsiloxane (PDMS) and polyurethane (PU).

The electronic component 207 is then placed "active side down" in the component region 204 of the substrate 201 (e.g. using pick-and-place methods or an alternative technique) so that the connectors 208 overlie the component ends 206 of the respective fluid channels 203. To hold the electronic component 207 in the correct position with respect to the fluid channels 203, an adhesive (or alternative attachment means) may be used to attach the electronic component to the component region 204.

Once the electronic component 207 is appropriately positioned on the substrate 201, the electrically conductive fluid 209 (e.g. an electrically conductive ink such as a metal nanoparticle ink or a metallo-organic decomposition ink) is deposited into the fluid reservoirs 202. A printing or coating process (e.g. one or more of inkjet printing, flexographic printing, gravure printing, aerosol jet printing, dip coating and slot coating) may be used to deposit the electrically conductive fluid 209 into the fluid reservoirs 202.

In the example shown in FIG. 2, the fluid reservoirs 202 and fluid channels 203 are formed on the surface 212 of the substrate 201 on which the electronic component 207 is appropriately positioned, and the fluid channels 203 are configured to extend substantially parallel to this surface 212. This arrangement allows a number of different processes to be used to form the fluid reservoirs 202/channels 203 and to deposit the electrically conductive fluid 209 into the fluid reservoirs 202 (or directly into the fluid channels 203). In practice, however, one or both of the fluid reservoirs 202 and fluid channels 203 may be partially located within the bulk of the substrate (e.g. as pores in the substrate 201). For example, one or more fluid channels may extend through the bulk 213 of the substrate 201 connecting one or more fluid reservoirs 202 on the surface 212 of the substrate 201 to the electronic component 207. This configuration may be used to increase the amount of surface area of the substrate 201 which is available for other electronic components and/or electrical connections.

The electrically conductive fluid 209 is then guided by the fluid channels 203 from the fluid reservoirs 202 to the electronic component 207 where it wets the connectors 208. Ideally, the viscosity of the electrically conductive fluid 209 would be between 1 mPa·s and 100 mPa·s, although higher values of viscosity just increase the length of time it takes to wick along the fluid channels 203. The electrically conductive fluid 209 is then allowed to solidify to form the electrical connections 210 to the connectors 208 of the electronic component 207. Solidification of the electrically conductive fluid 209 may be achieved by leaving it for a predetermined period of time to solidify naturally by heating the substrate 201 to cure/sinter the electrically conductive fluid 209, or by using UV light, moisture or chemical catalysis to cross-link the electrically conductive fluid 209 (when the electrically conductive fluid 209 comprises a conductive polymeric solution). If desired, a protective adhesive 211 can be deposited on top of the electronic component 207 after the electrical connections 210 have been formed to help prevent detachment of the electronic component 207 from the substrate 201 and/or damage to one or more of the newly formed electrical connections 210.

The substrate described herein therefore allows electrical connections to be made to an electronic component after the component has been placed on the substrate without the need to print on top of the component. This reduces the alignment accuracy and printing resolution required to form the electrical connections, and avoids any issues associated with ink flow on the surfaces of the electronic component. Furthermore, electrical connections as narrow as 2 μm can be formed using the fluid channels, which is considerably smaller than the >50 μm resolution of the scalable printing methods which are currently used. In addition, the use of such a substrate enables high processing speeds because (i) less accuracy is required to deposit the electrically conductive fluid into the fluid reservoirs than to print electrical connections directly onto the substrate, and (ii) the electrically conductive fluid can be deposited into the reservoirs at the same time as other electrical connections and/or components are formed on the substrate (e.g. using scalable printing methods). Even higher processing speeds can be achieved if multiple fluid channels are connected to a single fluid reservoir because only one deposition step is required to form multiple electrical connections.

The fluid channels may be configured to guide the electrically conductive fluid from the fluid reservoirs to the component region of the substrate using one or more of capillary action, Laplace pressure, fluidphilic interaction and fluidphobic interaction. Capillary action is likely to be the dominant transport mechanism in most cases, and refers to the spontaneous "wicking" of the electrically conductive fluid along the axis of the fluid channel due to the combination of surface tension within the fluid and adhesive forces between the fluid and the channel.

Figure 3A:
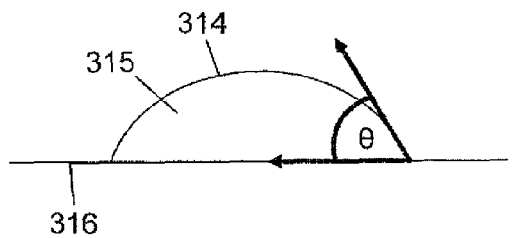
FIG. 3a shows a fluid droplet on a solid surface with a contact angle of less than 90°.
Figure 3B:
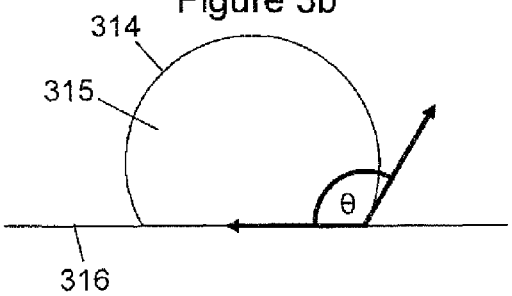
FIG. 3b shows a fluid droplet on a solid surface with a contact angle of greater than 90°.

In order for a fluid channel to transport a fluid, the surface of the fluid channel should be capable of being "wet" by the fluid. The ability of a surface to be wet by a fluid is generally defined by the contact angle that the fluid makes with the surface. Referring to FIGS. 3a and 3b, the contact angle ($\theta$) is the angle that the surface 314 of a fluid droplet 315 makes with the plane of the solid surface 316 on which the fluid 315 is supported. When $\theta$ is 90° or less, the solid surface 316 is considered to be wet by the fluid 315 (FIG. 3a). This type of surface 316 may be referred to as "fluidphilic". When $\theta$ is greater than 90°, on the other hand, the solid surface 316 is considered not to be wet by the fluid 315 (FIG. 3b). This type of surface 316 may be referred to as "fluidphobic". The ability of a surface 316 to be wet by a fluid 315 is influenced by the surface energy. It is therefore possible to modify the substrate surface to improve its fluid transport properties. In some embodiments, the fluid reservoirs may comprise a fluidphobic material and/or the fluid channels may comprise a fluidphilic material to facilitate guiding of the electrically conductive fluid from the fluid reservoirs to the component region of the substrate. The term "fluidphobic" may be taken to mean any material which is capable of repelling a fluid, and may encompass hydrophobic, lipophobic (oleophobic) and lyophobic materials. Likewise, the term "fluidphilic" may be taken to mean any material which is capable of attracting a fluid, and may encompass hydrophilic, lipophilic (oleophilic) and lyophilic materials. The fluidphilic material may be such that $\theta<30°$ within the fluid channels. In addition, a region of the substrate surrounding each fluid channel may comprise a fluidphobic material configured to guide any electrically conductive fluid deposited within this region into the fluid channel.

Figure 4A:
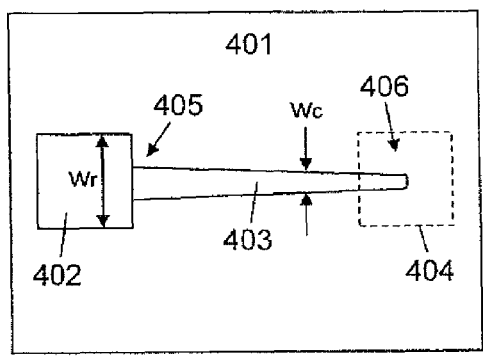
FIG. 4a shows a fluid channel of varying width (plan view)
Figure 4B:
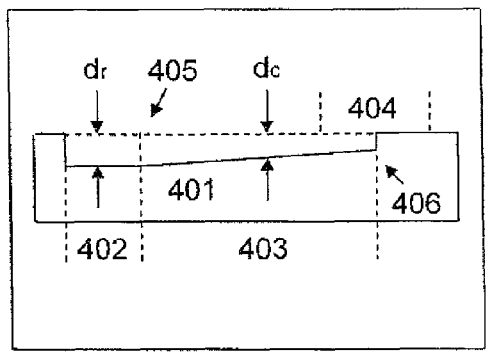
FIG. 4b shows a fluid channel of varying depth (plan view)
Figure 5A:
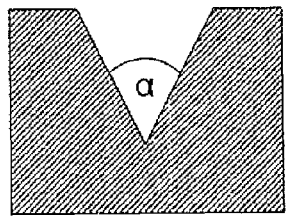
FIG. 5a shows a fluid channel with a triangular profile (cross-section)
Figure 5B:
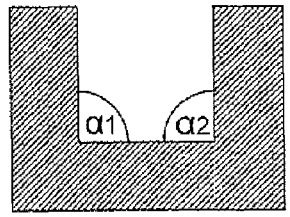
FIG. 5b shows a fluid channel with a square profile (cross-section)
Figure 5C:
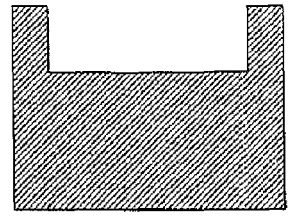
FIG. 5c shows a fluid channel with a rectangular profile (cross-section)
Figure 5D:
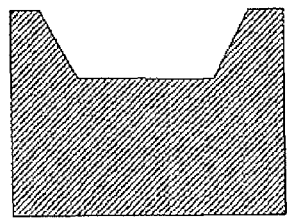
FIG. 5d shows a fluid channel with a symmetric trapezoidal profile (cross-section)
Figure 5E:
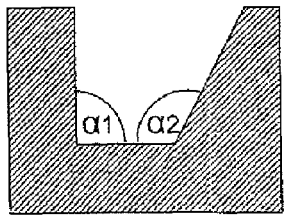
FIG. 5e shows a fluid channel with an asymmetric trapezoidal profile (cross-section)
Figure 5F:
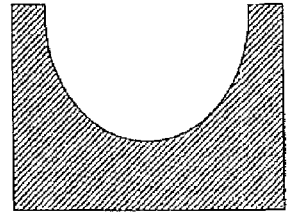
FIG. 5f shows a fluid channel with a concave profile (cross-section)

The structure of a fluid channel also affects the ability of the fluid channel to transport fluid. For example, the size, shape and channel angle (see below) of the fluid channel can each influence its transport properties. In this respect, one or more of the size and shape of the fluid channels may be configured to guide the electrically conductive fluid from the fluid reservoirs to the component region. In FIG. 4a, the width ($w_c$) of the fluid channel 403 decreases from the reservoir end 405 of the fluid channel 403 to the component end 406 at constant depth. The width ($w_r$) of the fluid reservoir 402 is shown for comparison. In this case, a combination of capillary action and Laplace pressure guides the electrically conductive fluid from the fluid reservoir 402 to the component region 404. In FIG. 4b, on the other hand, the depth ($d_c$) of the fluid channel 403 decreases from the reservoir end 405 of the fluid channel 403 to the component end 406 at constant width. The depth ($d_r$) of the fluid reservoir 402 is shown for comparison. Again, a combination of capillary action and Laplace pressure guides the electrically conductive fluid from the fluid reservoir 402 to the component region 404. To ensure that there are sufficient capillary forces to guide the electrically conductive fluid from the fluid reservoirs 402 to the component region 404 of the substrate 401, the depth of each fluid channel 403 should be between 0.3 and 5 µm, and the width of each fluid channel 403 should be between 2 and 20 µm.

The fluid channels may have a number of different profiles. For example, each fluid channel may have a triangular (FIG. 5a), square (FIG. 5b), rectangular (FIG. 5c), symmetric trapezoidal (FIG. 5d), asymmetric trapezoidal (FIG. 5e) or concave (FIG. 5f) profile. The channel angle ($\alpha$) of a fluid channel is defined as the angle between adjacent walls of the channel. As shown in FIGS. 5a to 5f, a fluid channel may have a single channel angle ($\alpha$), multiple channel angles ($\alpha_1$ and $\alpha_2$) or no channel angle. Also, in the case where a fluid channel comprises multiple channel angles, these angles may or may not be the same (e.g. compare FIG. 5b with FIG. 5e). To ensure that there are sufficient capillary forces to guide the electrically conductive fluid from the fluid reservoirs to the component region of the substrate, each channel angle should be between 10° and 120°. Furthermore, one or more of the material and shape of the fluid channels should be such that $\theta<90°-\alpha/2$ to facilitate transport of the electrically conductive fluid along the fluid channels.

As stated previously, formation of the electrical connections to the appropriately positioned electronic component using the electrically conductive fluid allows the electronic component to be interconnected to other electronic components using the fluid reservoirs and/or fluid channels. Ideally, the fluid reservoirs would be dimensioned as contact pads to allow the electronic component to be interconnected to the other electronic components using the electrically conductive fluid in the fluid reservoirs. For example, each fluid reservoir may have a width (denoted $w_r$ in FIG. 4a) of between 20 and 100 µm. These dimensions allow electrically conductive traces to be printed onto the surface of the substrate in electrical contact with the fluid reservoir using scalable printing methods.

Figure 6:
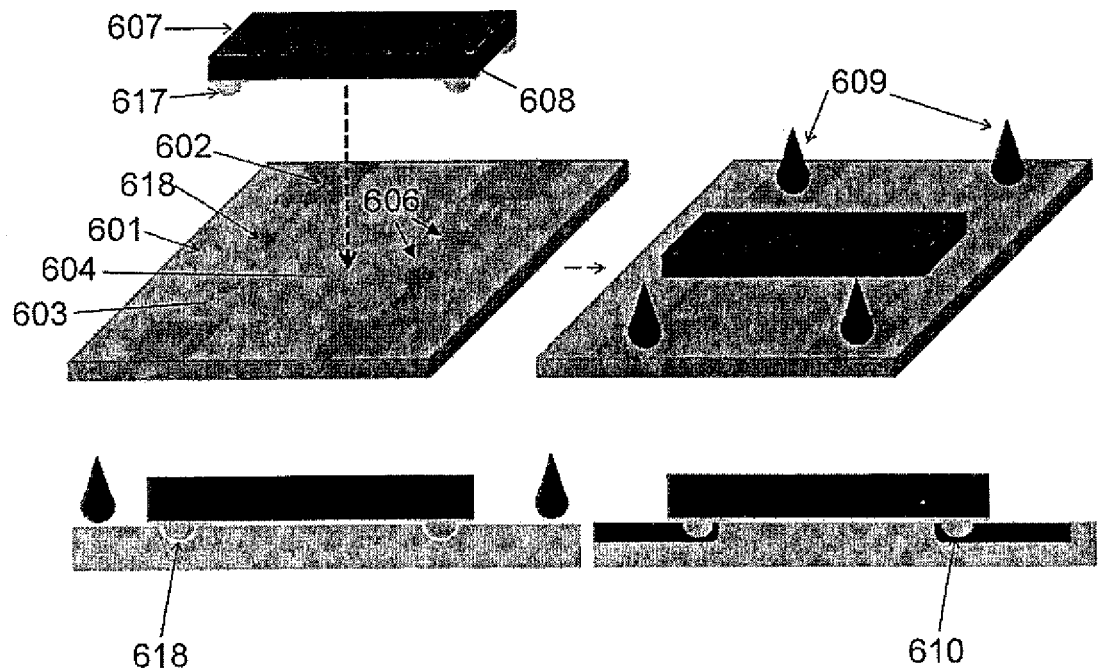
FIG. 6 shows an embodiment of the substrate described herein in which the component end of the fluid channel is configured to receive a protrusion of the connector of the electronic component (perspective view)

To enable a more reliable electrical connection between the electrically conductive fluid and the connectors of the electronic component, the size and shape of the component end of each fluid channel may be configured to complement the size and shape of the overlying connector. This is illustrated in FIG. 6 where the connectors 608 of the electronic component 607 each comprise a protrusion 617 and the component end 606 of each fluid channel 603 comprises a fluid cavity 618 configured to receive the protrusion 617 of the corresponding connector 606. Once the electronic component 607 is appropriately positioned on the substrate 601 (i.e. with each of the connectors 608 aligned with the fluid cavities 618), the electrically conductive fluid 609 is deposited into each of the fluid reservoirs 602 and guided through the respective fluid channels 603 to the component region 606 of the substrate 601 where it wets the protrusions 617 of the connectors 608 to enable formation of the electrical connections 610.

Figure 7:
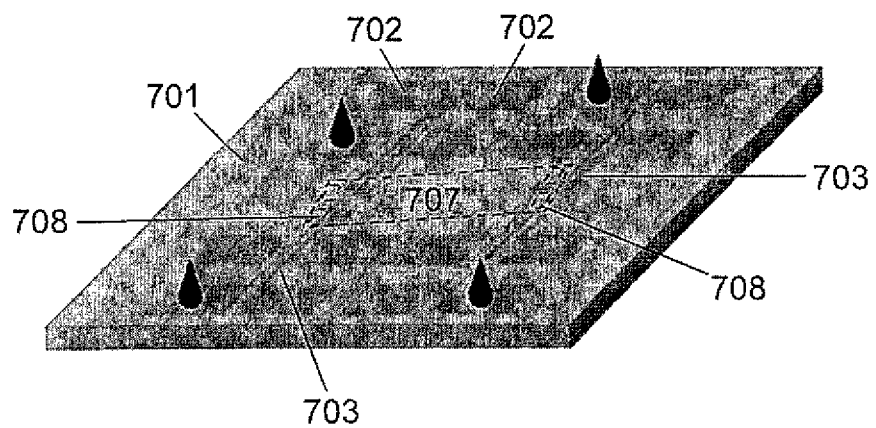
FIG. 7 shows an embodiment of the substrate described herein comprising a plurality of fluid channels each configured to enable the formation of an electrical connection to the same connector of the electronic component (perspective view)

The use of connector protrusions 617 and corresponding fluid cavities 618 also facilitates alignment of the electronic component 607 on the surface of the substrate 601. Another feature way of facilitating alignment of the electronic component 707 is to form a plurality of fluid channels 703 in the substrate 701 for each connector 708 of the electronic component 707 (as shown in FIG. 7). This approach relaxes the alignment accuracy by improving the chance of each connector 708 of the electronic component 707 overlying at least one of the fluid channels 703. Whilst multiple fluid channels 703 may be connected to the same fluid reservoir 702, it may be beneficial to use a separate fluid reservoir 702 for each fluid channel 703. This configuration allows the electrically conductive fluid 709 to be delivered to only those fluid channels 703 which are aligned with the connectors 708 of the electronic component 707 (as shown in FIG. 7). Not only does this reduce the number of fluid applications and the amount of electrically conductive fluid 709 used to form the electrical connections 703 to the electronic component 707, but it also helps to prevent the creation of short circuit defects on the substrate 701 via unnecessary electrical connections. In practice, optical inspection (e.g. using DropAim™ software) can be used to determine the fluid channels 703 which are best aligned with the connectors 708 of the electronic component 707.

Figure 8:
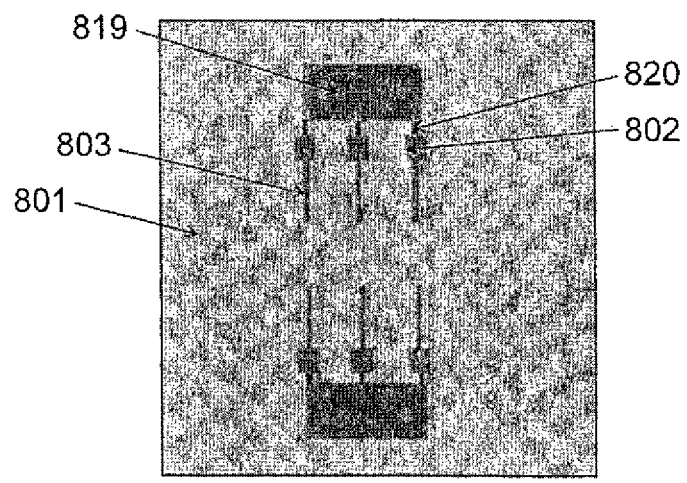
FIG. 8 shows an embodiment of the substrate described herein in which a plurality of fluid reservoirs and respective fluid channels are connected to a main fluid reservoir (plan view)

Another way of decreasing the number of fluid applications when the substrate 801 comprises a plurality of fluid reservoirs 802 and respective fluid channels 803 is to form a main fluid reservoir 819 for supplying each of the smaller fluid reservoirs 802 with electrically conductive fluid (as shown in FIG. 8). In this way, the electrically conductive fluid can be deposited into the main fluid reservoir 819 and guided to the respective fluid channels 803 via the smaller fluid reservoirs 802. The smaller fluid reservoirs 802 may be connected to the main fluid reservoir 819 via respective linking channels 820.

Since the smaller fluid reservoirs 802 are each connected to the main fluid reservoir 819, however, there is a chance that the smaller fluid reservoirs 802 may be electrically connected to one another via the main fluid reservoir 819 once the electrically conductive fluid solidifies. If the fluid channels 803 connected to the smaller fluid reservoirs 802 are used to form respective electrical connections to different connectors of the electronic component, then any electrical connection between the smaller fluid reservoirs 802 could potentially short-circuit the electronic component. In this respect, any such electrical connection needs to be removed. One way of achieving this is to use a fluidphobic material (e.g. such that the contact angle $\theta > 90°$) in the main fluid reservoir 819 and/or linking channels 820 to ensure that the electrically conductive fluid completely dewets these regions. Another option is to form the main fluid reservoir 819 and/or linking channels 820 such that one or both have a depth which is less than that of the smaller fluid reservoirs 802 and their respective fluid channels 803. This can easily be achieved (without increasing the fabrication time) using imprint lithography by pre-patterning the depth of the imprint tool. Additionally or alternatively, a post de-ashing treatment may be used to remove any electrically conductive fluid which has solidified in the main fluid reservoir 819 and/or linking channels 820 (e.g. by flash sintering the electrically conductive fluid in these regions at a higher power than is necessary to solidify the electrically conductive fluid).

Figure 9:
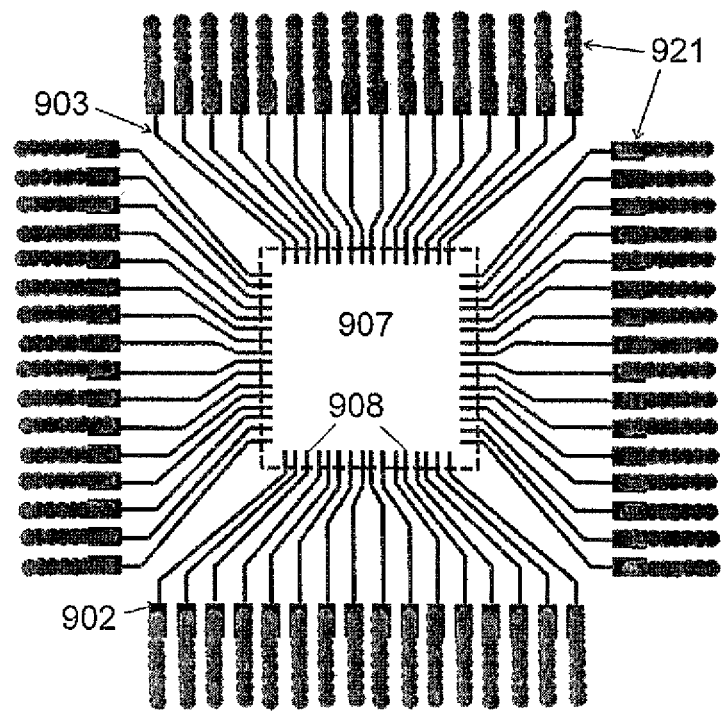
FIG. 9 shows an embodiment of the substrate described herein in which a plurality of fluid channels are arranged to form a fan-out pattern on the substrate (plan view)

The substrate described herein is particularly useful for forming electrical connections to electronic components 907 which comprise a plurality of closely-spaced connectors 908, such as the electronic component 907 shown in FIG. 9. In this example, the substrate comprises a plurality of fluid channels 903 which are configured to radiate out from the component region to form a fan-out pattern on the substrate. In addition, the spacing of the adjacent connectors 908 of the electronic component 907 is smaller than the resolution of the printing process (as indicated by the conductive ink tracks 921 deposited on top of the substrate). By depositing an electrically conductive fluid (i.e. the conductive ink) into the fluid reservoirs 902, the fluid is guided from the fluid reservoirs 902 to the respective connectors 908 to form the electrical connections, the widths of which are defined by the dimensions of the fluid channels 903. The conductive ink tracks 921 shown in FIG. 9 may constitute part of a larger printed circuit, e.g. printed traces and/or other electronic components.

Figure 10:
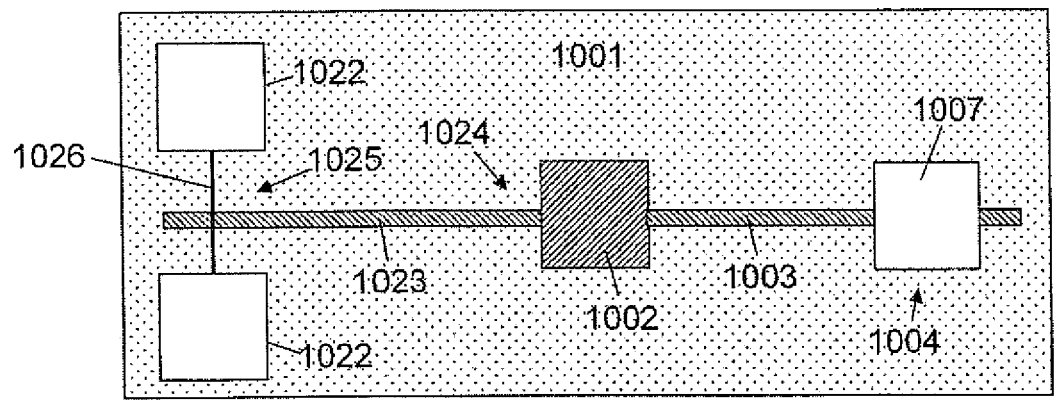
FIG. 10 shows an embodiment of the substrate described herein in which the substrate comprises a further fluid channel configured to enable the formation of an electrical connection to a conductive trace on the substrate (plan view)

Rather than interconnecting the appropriately positioned electronic component 1007 to other electronic components 1022 on the substrate 1001 using printed conductive traces extending from a fluid reservoir 1002 (and/or fluid channel 1003) to the other electronic components 1022, the substrate 1001 may incorporate a further fluid channel 1023 for this purpose (as illustrated in FIG. 10). The further fluid channel 1023 may, for example, be configured to extend from the fluid reservoir 1002 to guide the electrically conductive fluid from the fluid reservoir 1002 at a reservoir end 1024 of the further fluid channel 1023 through the further fluid channel 1023 to a circuitry end 1025 of the further fluid channel 1023. As shown in FIG. 10, the circuitry end 1025 of the further fluid channel 1023 may extend to a conductive trace 1026 which is electrically connected to the other electronic components 1022 to enable the formation of an electrical connection to the conductive trace 1026. In this scenario, when the electrically conductive fluid is deposited into the fluid reservoir 1002, it will flow in a first direction along the fluid channel 1003 to the component region 1004 of the substrate 1001, and also in a second direction along the further fluid channel 1023 to the conductive trace 1026.

Figure 11:
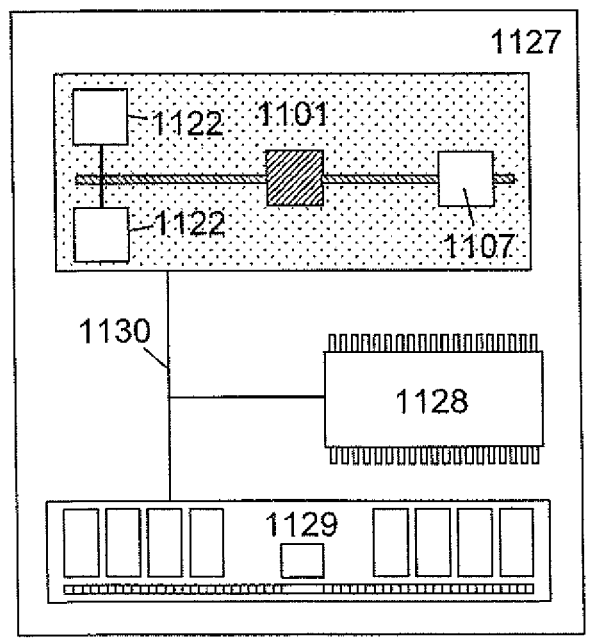
FIG. 11 shows an apparatus comprising the substrate described herein.

FIG. 11 shows one example of an apparatus 1127 comprising the substrate 1101 described herein. The apparatus 1127 also comprises a processor 1128 and a storage medium 1129 which are electrically connected to one another by a data bus 1130. The apparatus 1127 may be one or more of an electronic device, a portable electronic device, a telecommunications device, a portable telecommunications device and a module for any of the aforementioned devices.

In this example, the substrate 1101 is a printed circuit board configured to support, and provide electrical connections between, the various electronic components of the apparatus 1127 (including the processor 1128 and storage medium 1129). In particular, the substrate 1101 comprises an electronic component 1107 electrically connected in the component region of the substrate 1101 via its connector using the electrically conductive fluid in the fluid channel and/or fluid reservoir. The electronic component 1107 may be one or more of a discrete component, a silicon-based microchip and a surface-mount component. The surface-mount component may be one or more of a resistor, a capacitor, an inductor, a transistor, a diode, a photodiode and a light-emitting diode. The substrate 1101 may also comprise one or more other electronic components 1122 interconnected to the electronic component 1107 using the electrically conductive fluid in the fluid channel(s) and/or fluid reservoir(s). For example, the data bus 1130 may be formed by the electrically conductive fluid in one or more of the fluid channels.

The processor 1128 is configured for general operation of the apparatus 1127 by providing signalling to, and receiving signalling from, the other components to manage their operation. The processor 1128 may be a microprocessor, including an Application Specific Integrated Circuit (ASIC).

The storage medium 1129 is configured to store computer code configured to perform, control or enable operation of the apparatus 1127. The storage medium 1129 may also be configured to store settings for the other components. The processor 1128 may access the storage medium 1129 to retrieve the component settings in order to manage the operation of the other components. The storage medium 1129 may be a temporary storage medium such as a volatile random access memory. On the other hand, the storage medium 1129 may be a permanent storage medium such as a hard disk drive, a flash memory, or a non-volatile random access memory.

Figure 12A:
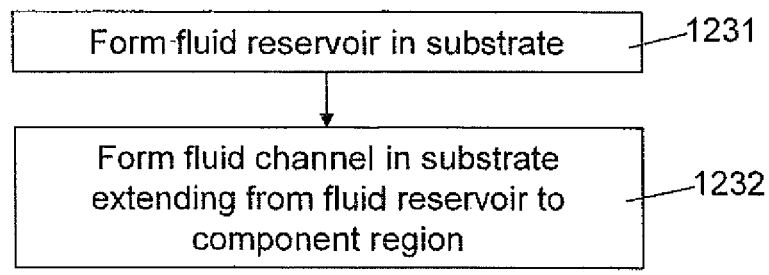
FIG. 12a shows the main steps of a method of preparing the substrate described herein.
Figure 12B:
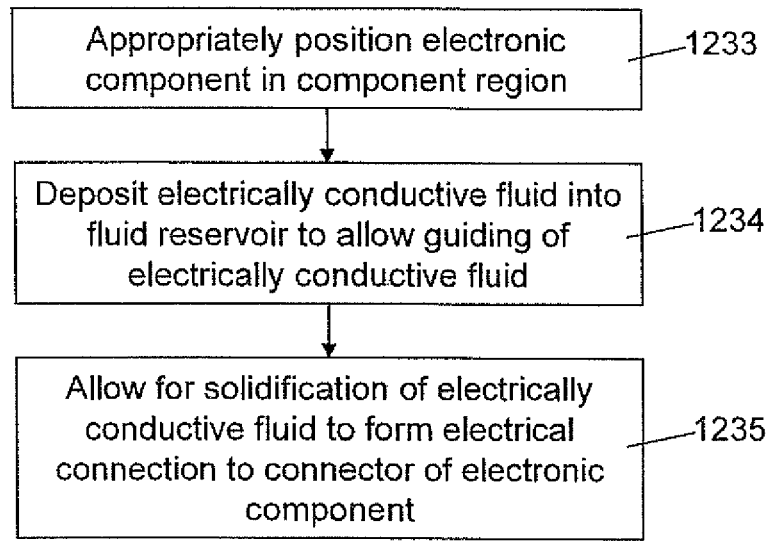
FIG. 12b shows the main steps of a method of using the substrate described herein.

The main steps 1231-1232 of a method of preparing the substrate described herein are illustrated schematically in FIG. 12a. Similarly, the main steps 1233-1235 of a method of using the substrate described herein are illustrated schematically in FIG. 12b. Steps 1231 and 1232 may or may not be performed as a single processing step. As described previously, a number of different techniques may be used to form the fluid reservoir(s) and fluid channel(s), position the electronic component, deposit the electrically conductive fluid and solidify the electrically conductive fluid. For example, the fluid reservoir(s) and fluid channel(s) may be formed in the substrate using one or more of hot-embossing, laser ablation, nanoimprinting, photolithography, and casting a substrate material as a solution over a mould before curing; the electronic component may be positioned in the component region using a pick-and-place method; the electrically conductive fluid may be deposited into the fluid reservoir(s) using one or more of inkjet printing, flexographic printing, gravure printing, aerosol jet printing, dip coating and slot coating; and the electrically conductive fluid may be solidified naturally or by heating the substrate to cure/sinter the electrically conductive fluid.

Figure 13:
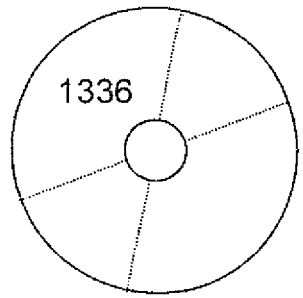
FIG. 13 shows a computer-readable medium comprising a computer program configured to perform, control or enable the methods of FIG. 12a and/or FIG. 12b.

FIG. 13 illustrates schematically a computer/processor readable medium 1336 providing a computer program according to one embodiment. In this example, the computer/processor readable medium 1336 is a disc such as a digital versatile disc (DVD) or a compact disc (CD). In other embodiments, the computer/processor readable medium 1336 may be any medium that has been programmed in such a way as to carry out an inventive function. The computer/processor readable medium 1336 may be a removable memory device such as a memory stick or memory card (SD, mini SD, micro SD or nano SD).

The computer program may comprise computer code configured to perform, control or enable preparation and/or use of the substrate. In particular, the computer program may be used to form the fluid reservoir(s) and fluid channel(s) in the substrate; position the electronic component in the component region; deposit the electrically conductive fluid into the fluid reservoir(s); and solidify the electrically conductive fluid.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A substrate comprising a main fluid reservoir and a connected fluid channel, the main fluid reservoir positioned away from a component region of the substrate, the fluid channel configured to extend from the main fluid reservoir to guide an electrically conductive fluid from the main fluid reservoir at a reservoir end of the fluid channel through the fluid channel to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the main fluid reservoir and the fluid channel;

wherein the substrate comprises at least one additional fluid reservoir and respective fluid channels, each additional fluid reservoir connected between its respective fluid channel and the main fluid reservoir and configured to deliver the electrically conductive fluid from the main fluid reservoir to the respective fluid channel; and wherein the at least one additional fluid reservoir is smaller than the main fluid reservoir.

2. The substrate of claim 1, wherein one or more of the main fluid reservoir and fluid channel at least partially open onto a surface of the substrate to allow for deposition of the electrically conductive fluid into the main fluid reservoir or fluid channel.

3. The substrate of claim 1, wherein the component end of the fluid channel extends into the component region of the substrate to be located underneath the appropriately positioned electronic component.

4. The substrate of claim 1, wherein the fluid channel is configured to extend substantially parallel to the surface of the substrate on which the electronic component is appropriately positioned.

5. The substrate of claim 1, wherein the main fluid reservoir is dimensioned as a contact pad to allow the appropriately positioned electronic component to be interconnected to the other electronic components using the electrically conductive fluid in the main fluid reservoir.

6. The substrate of claim 1, wherein the fluid channel is configured to guide the electrically conductive fluid from the main fluid reservoir to the component region using one or more of capillary action, Laplace pressure, fluidphilic interaction and fluidphobic interaction.

7. The substrate of claim 1, wherein one or more of the size and shape of the fluid channel is configured to guide the electrically conductive fluid from the main fluid reservoir to the component region.

8. The substrate of claim 1, wherein the fluid channel comprises a material configured to guide the electrically conductive fluid from the main fluid reservoir to the component region.

9. The substrate of claim 1, wherein the connector of the appropriately positioned electronic component comprises a protrusion, and wherein the component end of the fluid channel is configured to receive the protrusion of the connector to enable formation of the electrical connection.

10. The substrate of claim 1, wherein the substrate comprises a plurality of fluid channels each configured to extend from the main fluid reservoir to guide an electrically conductive fluid from the main fluid reservoir at a reservoir end of the fluid channel through the fluid channel to a component end of the fluid channel, the component end of each fluid channel extending to the component region of the substrate to enable the formation of an electrical connection to a connector of the appropriately positioned electronic component.

11. The substrate of claim 10, wherein the fluid channels are connected to, and extend from, the same or respective fluid reservoirs.

12. The substrate of claim 10, wherein the plurality of fluid channels are configured such that the component end of each fluid channel extends to the component region to enable the formation of an electrical connection to the same connector of the appropriately positioned electronic component.

13. The substrate of claim 10, wherein the appropriately positioned electronic component comprises a plurality of connectors, and wherein the plurality of fluid channels are configured such that the component end of each fluid channel extends to the component region to enable the formation of an electrical connection to a different connector of the appropriately positioned electronic component.

14. The substrate of claim 10, wherein the plurality of fluid channels radiate out from the component region to form a fan-out pattern on the substrate.

15. The substrate of claim 1, wherein the substrate comprises a conductive trace and a further fluid channel, the further fluid channel configured to extend from the main fluid reservoir to guide the electrically conductive fluid from the main fluid reservoir at a reservoir end of the further fluid channel through the further fluid channel to a circuitry end of the further fluid channel, the circuitry end extending to the conductive trace to enable the formation of an electrical connection to the conductive trace, formation of the electrical connection allowing the appropriately placed electronic component to be interconnected to the other electronic components using the electrically conductive fluid in the further fluid channel.

16. The substrate of claim 1, wherein the additional fluid reservoirs are connected to the main fluid reservoir via respective linking channels, and wherein one or both of the main fluid reservoir and the linking channels have a depth which is less than that of the fluid reservoirs and their respective fluid channels.

17. The substrate of claim 1, wherein the substrate comprises the electronic component electrically connected in the component region via its connector using the electrically conductive fluid in the fluid channel.

18. The substrate of claim 1, wherein the additional fluid reservoirs are connected to the main fluid reservoir via respective linking channels, and wherein the main fluid reservoir comprises a fluidphobic material configured to guide the electrically conductive fluid from the main fluid reservoir to the component region.

19. A method of preparing a substrate, the method comprising:

forming a main fluid reservoir in the substrate such that the main fluid reservoir is positioned away from a component region of the substrate;

forming a fluid channel in the substrate such that the fluid channel extends from the main fluid reservoir to guide an electrically conductive fluid from the main fluid reservoir at a reservoir end of the fluid channel through the fluid channel to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the main fluid reservoir and fluid channel; and forming at least one additional fluid reservoir and respective fluid channels, each additional fluid reservoir connected between its respective fluid channel and the main fluid reservoir and configured to deliver the electrically conductive fluid from the main fluid reservoir to the respective fluid channel;

wherein the at least one additional fluid reservoir is smaller than the main fluid reservoir.

20. A method of using a substrate, the substrate comprising a main fluid reservoir and a connected fluid channel, the main fluid reservoir positioned away from a component region of the substrate, the fluid channel configured to extend from the main fluid reservoir to guide an electrically conductive fluid from the main fluid reservoir at a reservoir end of the fluid channel through the fluid channel and through at least one additional fluid reservoir to a component end of the fluid channel, the component end extending to the component region of the substrate to enable the formation of an electrical connection to a connector of an electronic component appropriately positioned in the component region, formation of the electrical connection allowing the electronic component to be interconnected to other electronic components using one or more of the main fluid reservoir, the at least one additional fluid reservoir, and the fluid channel, the method comprising:

appropriately positioning the electronic component in the component region;

depositing the electrically conductive fluid into the main fluid reservoir to allow for guiding of the electrically conductive fluid from the main fluid reservoir at the reservoir end of the fluid channel through the at least one additional fluid reservoir and through the fluid channel to the component end of the fluid channel; and allowing for solidification of the electrically conductive fluid to form the electrical connection to the connector of the electronic component;

wherein the at least one additional fluid reservoir is smaller than the main fluid reservoir.

\* \* \* \* \*